US009544686B2

(12) United States Patent
Cecchin et al.

(10) Patent No.: US 9,544,686 B2
(45) Date of Patent: Jan. 10, 2017

(54) SOLID STATE RELAY CIRCUIT ARRANGEMENT FOR AUDIO SIGNALS AND SWITCHING SYSTEM

(71) Applicant: Magneti Marelli S.p.A., Corbetta (Milan) (IT)

(72) Inventors: Jacopo Cecchin, Corbetta (IT); Roberto Vettori, Corbetta (IT); Davide Gonella, Corbetta (IT); Alessandro Bergamini, Corbetta (IT)

(73) Assignee: Magneti Marelli S.p.A., Corbetta (Milan) (IT)

( * ) Notice: Subject to any disclaimer, the term of this patent is extended or adjusted under 35 U.S.C. 154(b) by 0 days.

(21) Appl. No.: 14/970,724

(22) Filed: Dec. 16, 2015

(65) Prior Publication Data

US 2016/0173980 A1    Jun. 16, 2016

(30) Foreign Application Priority Data

Dec. 16, 2014   (IT) .............................. TO2014A1049

(51) Int. Cl.
*H04R 3/00* (2006.01)
*H03K 17/687* (2006.01)

(52) U.S. Cl.
CPC ............ *H04R 3/00* (2013.01); *H03K 17/6874* (2013.01); *H04R 3/002* (2013.01); *H03K 2217/0009* (2013.01); *H04R 2203/00* (2013.01); *H04R 2420/03* (2013.01)

(58) Field of Classification Search
None
See application file for complete search history.

(56) References Cited

U.S. PATENT DOCUMENTS

| 4,096,443 A | * | 6/1978 | Gilson | .................... H03F 3/265 |
| | | | | 330/264 |
| 4,992,751 A | * | 2/1991 | Attwood | ................... H03F 3/38 |
| | | | | 330/10 |
| 5,208,865 A | | 5/1993 | Friske et al. | |
| 5,444,312 A | | 8/1995 | Noblett et al. | |
| (Continued) | | | | |

OTHER PUBLICATIONS

Search Report issued by the Italian Patent Office for Italian Patent Application No. TO2014A001049 dated Aug. 3, 2015.

(Continued)

*Primary Examiner* — Paul Huber
(74) *Attorney, Agent, or Firm* — Howard & Howard Attorneys PLLC

(57) ABSTRACT

A solid state relay circuit arrangement for audio signals is described, of the type comprising a first MOSFET and a second MOSFET in a back-to-back configuration, adapted to receive an input signal on the source electrode of the first MOSFET and to take the output signal on the source electrode of the second MOSFET, with a driving voltage being applied to the gate electrodes of said first MOSFET and second MOSFET, apt to change, on the basis of its value, the operational state of said first MOSFET and second MOSFET, According to the invention, each of said first MOSFET and second MOSFET includes a respective bypass capacitor arranged between its source electrode and its gate electrode, having such a capacitance value to determine a bypass path for the input signal from the source electrode to the gate electrode in the operating frequency range of said input signal.

10 Claims, 11 Drawing Sheets

(56) References Cited

U.S. PATENT DOCUMENTS

| | | |
|---|---|---|
| 6,621,907 B1 | 9/2003 | Smith |
| 2007/0133144 A1 | 6/2007 | Lewis |
| 2014/0301588 A1* | 10/2014 | Glover .................. H03G 7/002 381/354 |

OTHER PUBLICATIONS

Bishop, Anthony, "Solid-State Relay Handbook with Applications," pp. 74-76 and 93-95, (1986).

* cited by examiner

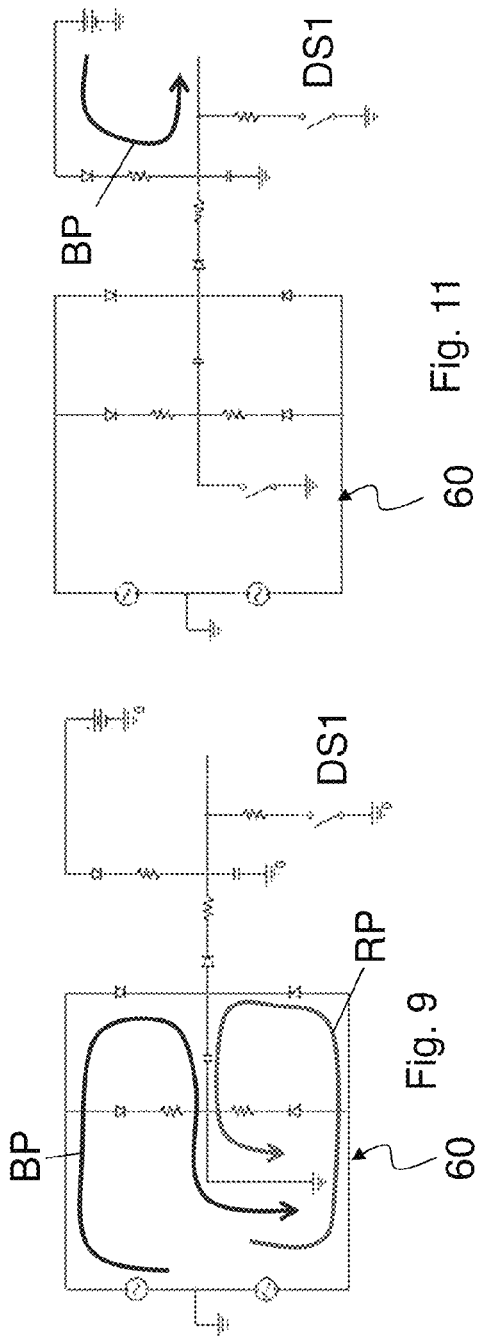

SOLID STATE RELAY CIRCUIT ARRANGEMENT FOR AUDIO SIGNALS AND SWITCHING SYSTEM

CROSS-REFERENCE TO RELATED APPLICATIONS

The present application claims priority to and all the benefits of Italian Patent Application No. TO 2014 A 001049, filed on Dec. 16, 2014, which is hereby expressly incorporated herein by reference in its entirety.

BACKGROUND OF THE INVENTION

1. Field of the Invention

The present invention relates to a solid state relay circuit arrangement, for audio signals, of the type comprising a first MOSFET and a second MOSFET in a back-to-back configuration, adapted to receive an input signal on the source electrode of the first MOSFET and to take the output signal on the source electrode of the second MOSFET, with a driving voltage being applied to the gate electrodes of said first MOSFET and second MOSFET, apt to change, on the basis of its value, the operational state of said first MOSFET and second MOSFET.

2. Description of the Related Art

Often in audio systems, it is required to operate a switching between input audio signals towards an output, such as a speaker. For example, in the automotive sector Telematic Control Units (TCU) are known, in which it is required to switch the audio path from the external audio module to the internal audio amplifier, which becomes active during e-Call type voice communications.

The usual solution to implement the audio switch is to use a relay to switch the audio path. This component, in electromechanical form, presents several drawbacks in terms of reliability, oxidation of the contacts, minimum current problems (wetting current), the contact resistance in the presence of low amplitude signals and cost.

Solid State Relays (SSR) are components frequently used for switching because, compared to electromechanical relays, they are not affected by the disadvantages outlined above.

A solid state relay arrangement of known type used in analog power switches is that shown in FIG. 1, where a solid state relay arrangement 10 comprises a pair of MOSFET transistors, a first MOSFET transistor M1 and a second MOSFET transistor M2, connected in the configuration known as "back-to-back" or rather, through their respective drain electrodes D1, D2. A source electrode S1 of the first MOSFET M1 receives an input signal $V_{s1}$, for example an audio signal, from an input signal generator 21 and this first MOSFET M1 presents a first zener-type diode 24 connected between the source electrode S1 and its gate electrode G1, to protect the gate from ESD (Electrostatic Discharge).

Similarly, the second MOSFET M1 has a source electrode S2 on which a voltage signal $V_{s2}$ is formed, to which the output is connected, or rather a speaker 22. This second MOSFET M2 presents a second zener diode 26, connected between the source electrode S2 and a gate electrode G2.

The gates G1 and G2 of the MOSFETs M1 and M2 are connected to a driving voltage generator 30, or polarization voltage, comprising a driving series impedance 29, which generates a driving voltage $V_{bias}$ on a driving node P downstream of the series impedance 29. As discussed further below, the voltage on the driving node P is used to control the operating states of the MOSFETs M1, M2, in particular between the ON state, the OFF state and the ohmic region. Numeral 35 in FIG. 1 indicates a ground reference.

In this case, to turn on the MOSFET M1, that is, to take it to the ON state, it is necessary that the driving voltage $V_{bias}$ is:

$$V_{bias} \geq V_{s1\_max} + V_{gs1\_th}$$

where $V_{s1\_max}$ indicates the maximum voltage on the source S1 and $V_{gs1\_th}$ indicates the threshold gate-source voltage of the first MOSFET M1. The first MOSFET M1 then enters into the ohmic region of its characteristic function if:

$$V_{bias} >> V_{s1\_max}$$

Similar considerations are valid for the second MOSFET M2, for which the ohmic region is only reached if:

$$V_{ds\_M2} \leq V_{gs2} - V_{gs2\_th}$$

where $V_{ds\_M2}$ is its drain-source voltage, while $V_{gs2}$ indicates the gate-source voltage, and $V_{gs2\_th}$ is the threshold voltage. This condition implies that the second MOSFET M2 only enters into the ohmic region if:

$$V_{bias} >> V_{s1\_max}$$

In FIG. 2, a waveform of the input signal is shown $V_{s1}$, for example an audio signal, with a sinusoidal trend, as a function of the time t, having an amplitude A, and offset voltage $V_{off}$.

With an input signal $V_{s1}$ such as the signal shown in FIG. 2, the minimum driving voltage $V_{bias}$ able to drive the MOSFETs M1 and M2 into the ohmic region for the entire period of the input waveform of FIG. 2 is:

$$V_{bias} \geq (V_{OFF} + A) + V_{gs\_th}$$

With the solid state relay topology 10 shown in FIG. 1, the driving voltage must be greater than the maximum peak voltage $V_{peak\_max}$ of the input signal $V_{s1}$, with the aim of guaranteeing the good conduction of the MOSFETs M1 and M2. In fact, for the maximum peak voltage $V_{peak\_max}$:

$$V_{peak\_max} = V_{off} + A$$

it is, in fact:

$$V_{bias} \geq V_{peak\_max} + V_{gs1,2\_th}$$

where $V_{gs1,2\_th}$ indicates the gate-source threshold voltage of the first or the second MOSFET, which are assumed equal.

Furthermore, in the circuit arrangement 10 of FIG. 1, the voltages between gate and source $V_{gs1,2}$ of the MOSFETs M1 and M2 vary with the amplitude A of the signal, maintaining the form of the signal, so that if the input signal $V_{s1}$ is sinusoidal, the gate-source voltage $V_{gs1,2}$ is also sinusoidal. This condition causes a non-linear characteristic of the circuit arrangement 10 when it is in the ON state, that is, turned on, and the input signal $V_{s1}$ has a high dynamic range, or rather, a high ratio between maximum and minimum amplitude, because it has a channel modulation in place in the MOSFETs due to the fluctuations of their gate-source voltage $V_{gs1,2}$ The drain-source resistance in the ON state $R_{DS\_ON}$, due to the fluctuations of the gate-source voltage $V_{gs1,2}$ is subject to a non-linear variation. This causes a signal distortion on the load of the switching circuit, for example the loudspeaker.

SUMMARY OF THE INVENTION

The present invention aims is directed toward a solid state relay circuit arrangement that allows the use of a lower driving voltage and, in addition, to minimize the distortion of the signal on the load.

According to the present invention, this object is achieved in a solid state relay circuit arrangement having a first MOSFET and a second MOSFET disposed in a back-to-back relationship with respect to each other and so as to receive an input signal on the source electrode of the first MOSFET and to take the output signal on the source electrode of the second MOSFET. A driving voltage is applied to the gate electrodes of said first MOSFET and second MOSFET, apt to change, on the basis of its value, the operational state of said first MOSFET and second MOSFET. Each of said first MOSFET and second MOSFET including a respective bypass capacitor arranged between its source electrode and its gate electrode, having such a capacitance value to determine a bypass path for the input signal from the source electrode to the gate electrode in the operating frequency range of said input signal.

BRIEF DESCRIPTION OF THE DRAWINGS

Other advantages of the invention will be readily appreciated as the same becomes better understood by reference to the following detailed description when considered in connection with the accompanying drawings, wherein:

FIG. 9 shows one operating state of the module of FIG. 8;

FIG. 10 shows another operating state of the module of FIG. 8;

FIG. 11 shows still another operating state of the module of FIG. 8;

DETAILED DESCRIPTION OF THE INVENTION

The solid state relay circuit arrangement of the present invention includes, in a back-to-back MOSFET relay topology, the insertion of bypass capacitors between the source electrode of the gate of the MOSFETs, in order to operate a bypass between the source and the gate of the MOSFETs in the frequency range of the input signal, in particular starting from frequency values less than or equal to the frequency of the input signal, and to decouple the driving voltage generator from the gates of the MOSFETs through the interposition of an RC network which, in cooperation with the bypass capacitors defines a lower cut-off frequency than the operation of the circuit arrangement.

A system for switching audio signals from a plurality of audio sources onto a load, in particular a loudspeaker, uses these solid state relay circuit arrangements on audio signals to be switched, and further comprises a driving and "sensing" circuit, or rather detecting, configured to apply a different driving voltage to the solid state relay circuit arrangements as a function of the characteristics of the input audio signals, in particular if single-ended, differential or zero mean, in particular if the input signals are provided with offset or have zero mean.

As mentioned, the input signals are, for example, relative to two or more audio sources (for example the output module of a radio) and the outputs can be represented by one or more loudspeakers. The switching system of audio signals preferably allows the switching of the audio sources onto common loudspeakers.

The input audio sources can generate single-ended-type signals, with or without offset, or rather whose voltages are measured with respect to the ground, or differential, in order to support any type of audio amplifier (Bridge Tied Load, differential signals with offset, differential signals with zero mean, single-ended with offset or with zero mean).

Figure 1:
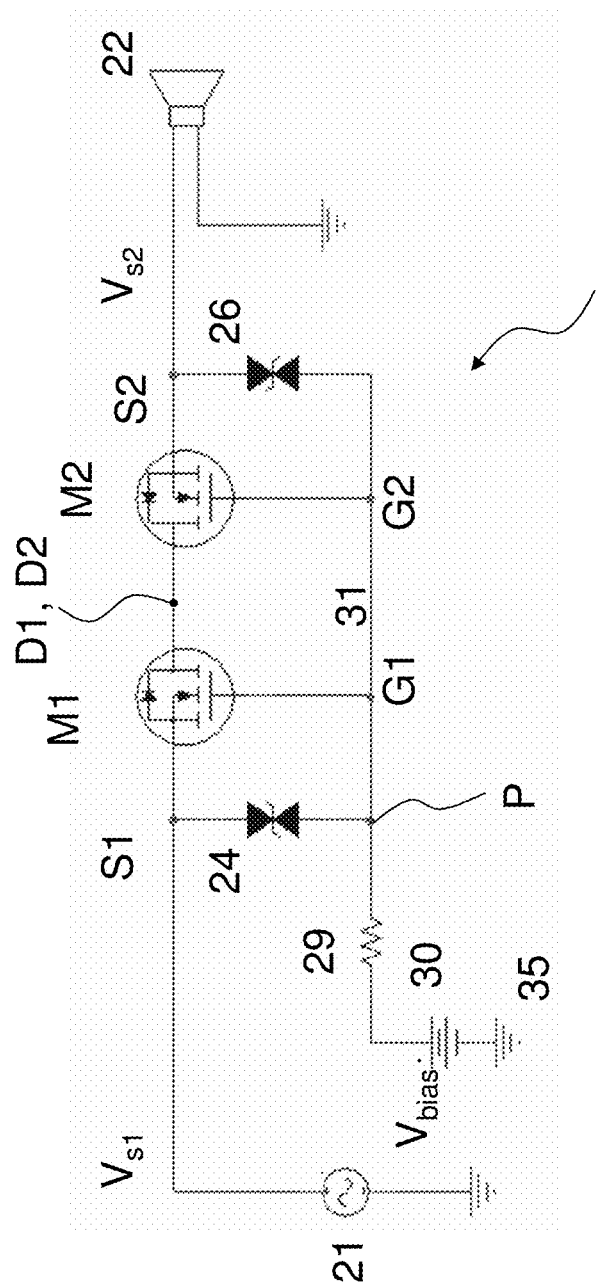
FIG. 1 shows a block circuit diagram of a solid state relay circuit arrangement according to the prior art.
Figure 2:
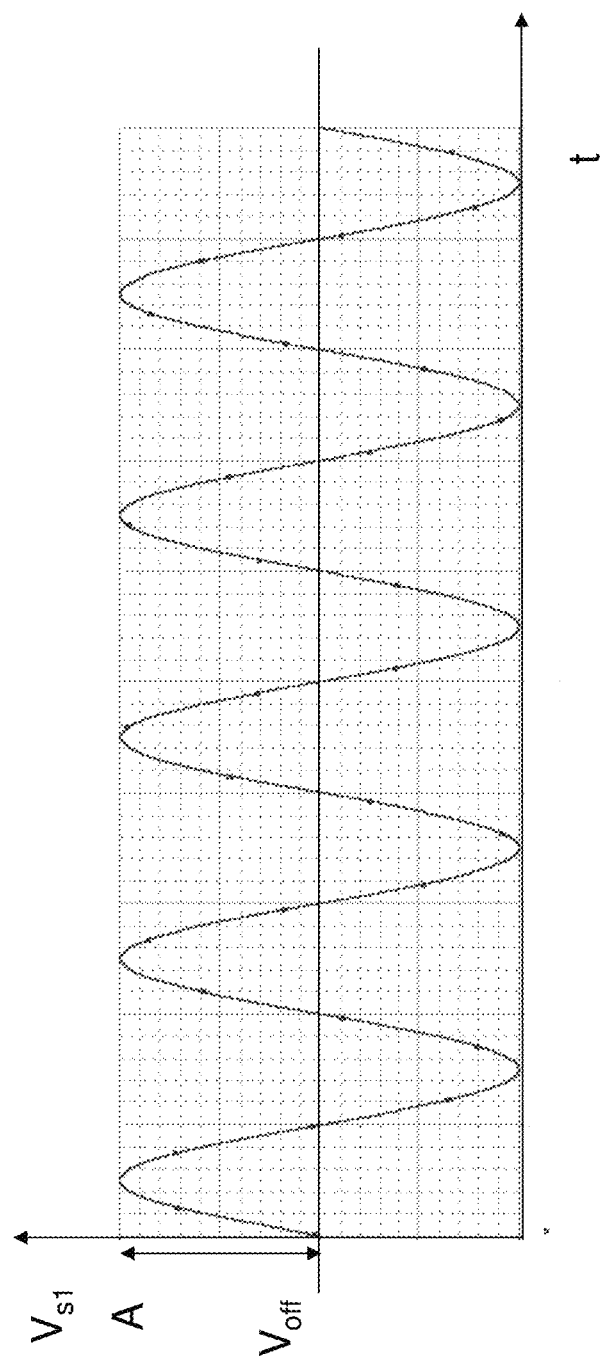
FIG. 2 shows a diagram of an input signal managed by the arrangement of FIG. 1.
Figure 3:
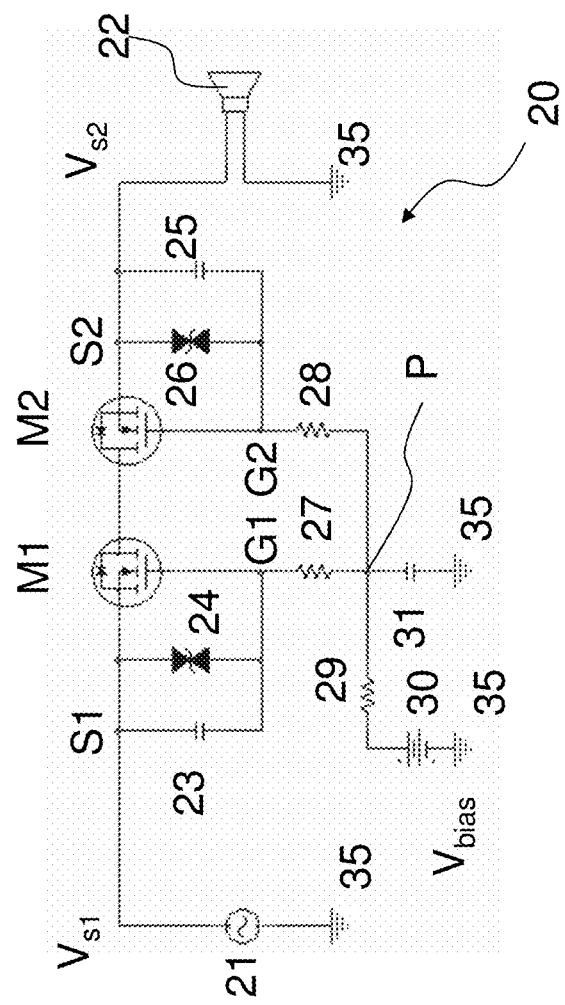
FIG. 3 shows a circuit diagram of a solid state relay circuit arrangement according to the invention.

For simplicity, in order to illustrate the solution according to the invention, a single-ended configuration is initially discussed here (in which the signal can be zero mean or have an offset), shown in FIG. 3, in which equal reference numbers indicate analogous components to those of the circuit arrangement 10 of FIG. 1.

Therefore, FIG. 1 shows a solid state relay circuit arrangement 20 which has a topology analogous to the circuit 10 of FIG. 1, in that a pair of MOSFETs M1, M2 is interposed on the path of the input signal to be switched, in back-to-back configuration, joined through the drain electrodes, the input signal being applied on the source S1 of the first MOSFET M1, while the output signal is taken on the source S2 of the second MOSFET. The driving voltage $V_{bias}$ on the gates G1, G2 is applied, even if not directly.

However, in the solid state relay circuit arrangement 20, the first MOSFET M1 also includes a capacitor 23, connected between the source S1 and the gate electrode G1, with capacitance C1, in parallel with the diode 24. Similarly, the second MOSFET M2 presents a capacitor 25 connected between its source electrode S2 and gate electrode G2, with capacitance C2, in parallel with the diode 26.

The driving generator 30 downstream of the impedance 29 identifies the driving node P, which, in this case, a cut-off capacitor 31 is connected to ground with capacitance value C3. The gates G1 and G2 of the MOSFETs M1 and M2 are connected, through respective resistors 27 and 28, having resistance values R1 and R2, to the driving node P of the driving voltage generator 30, in particular to the driving series impedance 29, which generates the driving voltage $V_{bias}$.

A reactance $X_{C1}$ of the capacitor 23 is worth:

$$X_{C1} = \frac{1}{2 * \pi * C_1 * f_{S1}}$$

where C1 is the value of the capacitance of the capacitor 23 and $f_{s1}$ is the frequency of the input signal $V_{s1}$.

If the reactance $X_{C1}$ is low, or rather, if the reactance $X_{C1}$ is of such a value to be able to allow the passage of the input signal $V_{s1}$, in particular without loss of signal (or rather below the defined value of signal loss), the alternate component of the input signal $V_{s1}$ is bypassed by the source S1 node of the first MOSFET M1 towards the gate G1 node and the gate-source voltage $V_{gs1}$ of the first MOSFET M1 has a low fluctuation in amplitude, in particular it is not influenced by the dynamics of the input signal $V_{s1}$. The bypass capacitors 23 and 25 are sized in order to provide low reactance values starting from the lower limit of the range of frequencies $f_{s1}$ assumable by the input audio signal. The bypass capacitors 23 and 25 identify the operating frequency range of the device according to the invention. Under a given frequency, this device does not behave as described above with respect to the values of $V_{bias}$ and to the distortion. Below are examples of sizing and indications about the range of the audio signals for which the circuit is designed.

Therefore, in this range of operation frequencies that render the bypass capacitors 23 and 25 operational, if the driving voltage $V_{bias}$ is greater than the offset voltage $V_{off}$ plus its threshold voltage $V_{gs\_th1}$, the first MOSFET M1 enters into conduction and its gate-source voltage $V_{gs1}$ remains constant, even if the amplitude of the input signal $V_{s1}$ is varied.

Figure 8:
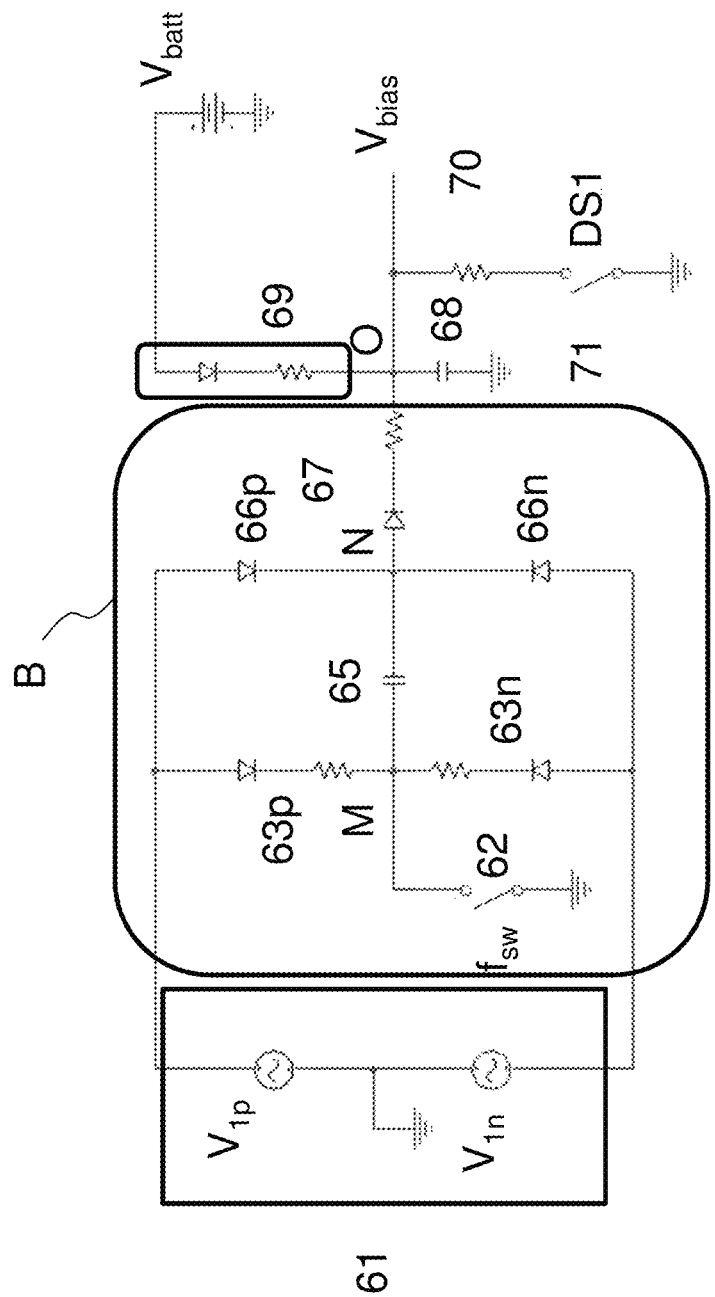
FIG. 8 shows a circuit diagram of a module of the system of FIG. 7.

In the case in which the input signal $V_{s1}$ is a zero mean signal (single-ended or differential), the device can be driven with a driving voltage $V_{bias}$ equal to:

$$V_{bias} \geq V_{gs\_th1,2}$$

which, in particular, in the case of using a sensing circuit, is supplied by the branch 69 in FIG. 8.

If the first MOSFET M1 is conducting, or rather in the ON state the voltage on the drain D1 is approximately equal to the voltage on the source S1. The second MOSFET M2 is brought into conduction if the driving voltage $V_{bias}$ is such that:

$$V_{bias} \geq V_{off} + V_{gs\_th2}$$

or rather greater than the threshold voltage plus the possible offset voltage, $V_{off}$, which is only present, however, if the input signal is not zero mean.

An increasing voltage of the input signal $V_{s1}$ corresponds with an increasing voltage at the second source S2 node, and the alternate component of the input signal is bypassed by the second capacitor 25, with capacitance value C2, if the reactances $X_{C2}$ and $X_{C1}$ of the two capacitors 23 and 25 are approximately equal, or rather, $X_{C2} \cong X_{C1}$. In this condition, the gate-source voltage $V_{gs2}$ of the second MOSFET M2 remains constant and is not subject to fluctuations due to the alternate component of the input signal $V_{s1}$. In fact, the capacitors 23 and 25 are used for bypassing the alternate component of the input signal $V_{s1}$ and the value of the driving voltage $V_{bias}$ used for switching the switching circuit on and off does not depend on the amplitude of the input signal $V_{s1}$.

A lower cut-off frequency $f_L$ than the band of the switch is controlled by the capacitance values of the bypass capacitors 23, 25, which are preferably equal, C1=C2=C, of the resistors 27, 28, which are preferably equal, R=R1=R2, and the capacitance $C_3$ of the capacitor 31, or rather:

$$f_L = \frac{1}{2*\pi*R1*\frac{C_1*C_3}{C_1+C_3}}$$

Therefore, the components 27, 28, 31 detect an RC network interposed between the driving voltage generator 30 and the gates G1, G2 of the MOSFETs M1, M2, the values of the components of said RC network in cooperation with the capacitance values of the bypass capacitors 23, 25 defining a lower cut-off frequency of operation of the circuit 20. From equation just reported, it follows that, for example, the time constant of the RC network is a function of the product of the resistance R, equal in this case, of the resistors 27, 28 and of the parallel between the capacitance C, equal in this case, of the bypass capacitors 23 or 25 and the capacitance $C_3$ of the cut-off capacitor 30.

To define the sizing values for the values R1, C1, C3, a condition can be indicated, for example, in which the frequency $f_L$ for audio applications is less than or equal to a determined frequency value, for example, approximately 10 Hz, or rather, less than the minimum frequency of the audio spectrum (20 Hz), so as to obtain a flat response in the audio band.

$$f_L = \frac{1}{2*\pi*R1*\frac{C_1*C_3}{C_1+C_3}} \leq 10 \text{ Hz}$$

Of course, this condition then allows the choice of the values according to the project needs in order to implement the RC constant that determines the condition on the lower cut-off frequency $f_L$. Note that, in general, the condition of the reactance $X_{C1}$ is chosen first, or rather, the capacitance value C1=C2=C in order to allow the passage of the input signal $V_{s1}$ below the defined value of signal loss, therefore, the value of the resistor pair 27, cut-off capacitance 30 then follows, given a cut-off frequency value to be obtained.

Figure 4:
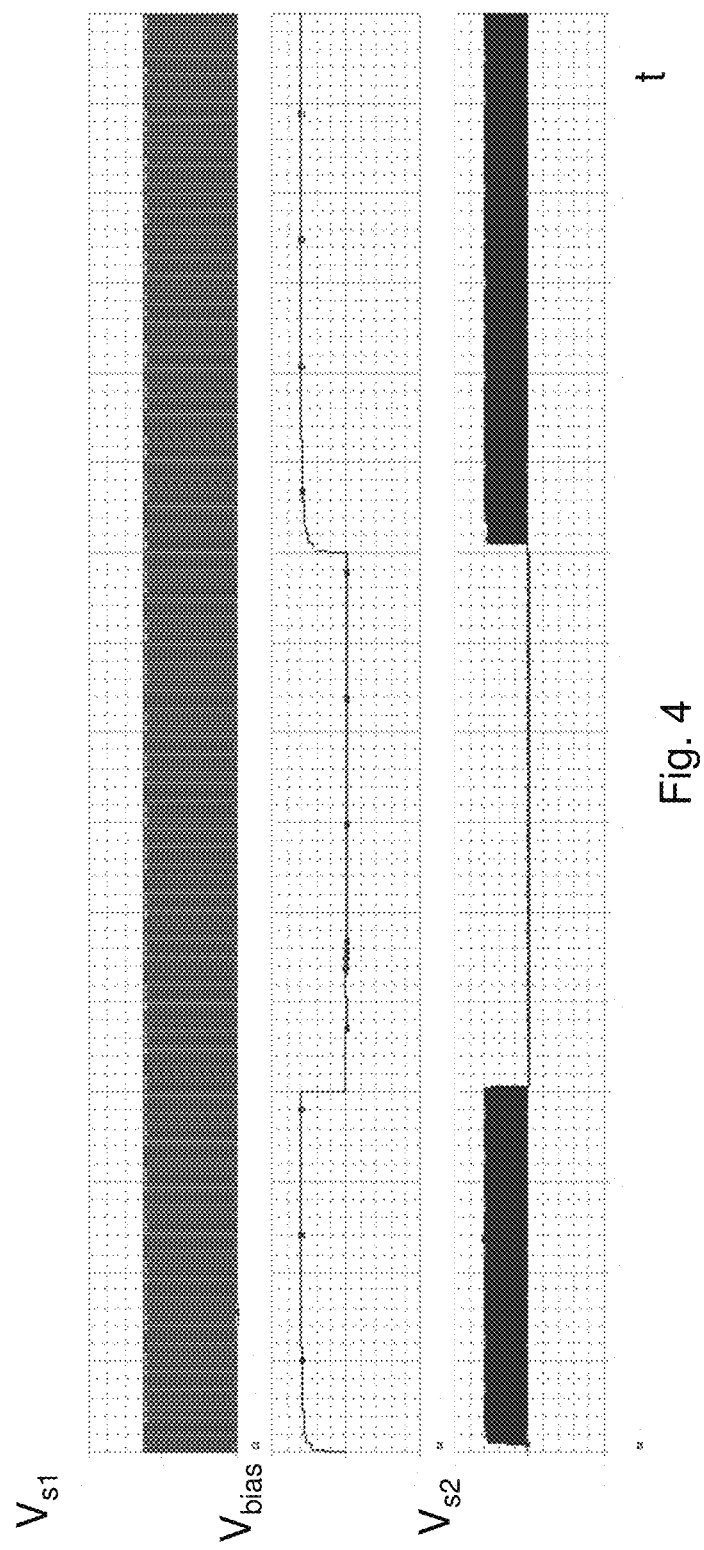
FIG. 4 shows diagrams of signals operating in the solid state relay circuit arrangement according to the invention.
Figure 5:
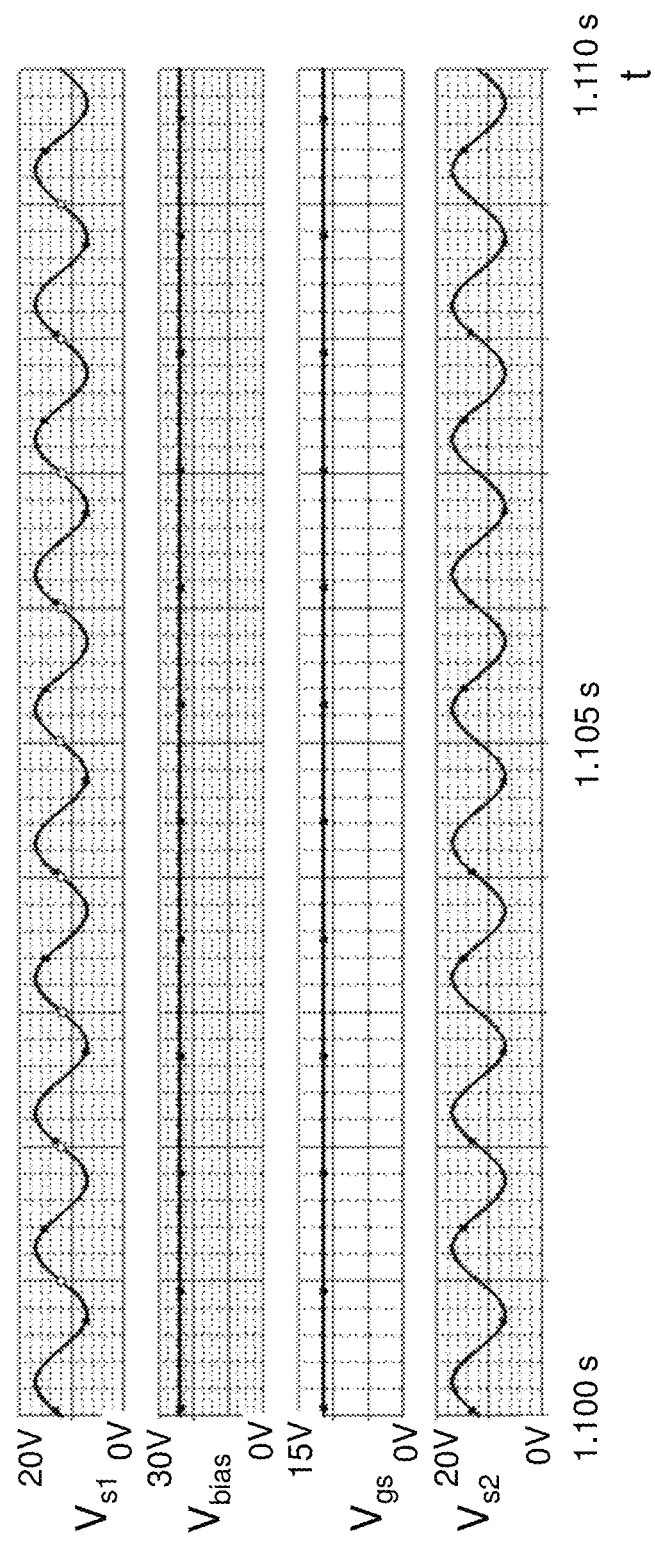
FIG. 5 shows diagrams of signals operating in the solid state relay circuit arrangement according to the invention.
Figure 6:
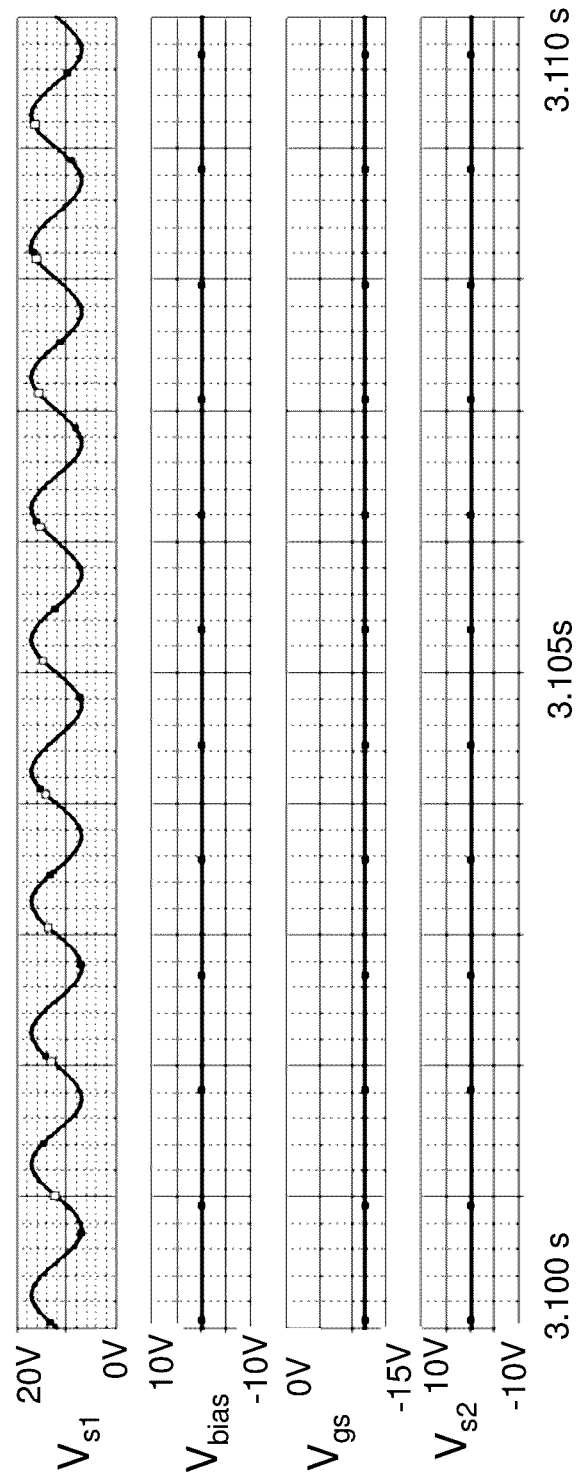
FIG. 6 shows diagrams of signals operating in the solid state relay circuit arrangement according to the invention.

FIGS. 4, 5 and 6 show the waveforms of the switching circuit 20 assuming that the input signal $V_{s1}$ has an amplitude A=6V, offset voltage $V_{off}$=6V and driving voltage $V_{bias}$=12V when the switching circuit 20 is in the ON state. When the switching circuit 20 is turned off (OFF-state) the driving voltage $V_{bias}$ is equal to 0V. In the waveforms shown in these figures, it is possible to note that the gate-source voltages $V_{gs1}$ and $V_{gs2}$ remain constant during the conduction activity and do not present fluctuations relative to the alternate component of the input signal $V_{s1}$. There are not, therefore, channel modulation effects of the MOSFETs, therefore, distortions of the signal present at the output of the second source S2 are prevented.

Therefore, finally for the switching circuit 20, the driving voltage must only be greater than the threshold voltage $V_{gs1,2\_th}$ of the MOSFET plus the possible offset voltage $V_{off}$ of the input signal $V_{s1}$.

$$V_{bias} \geq V_{off} + V_{gs1,2\_th}$$

The solid state relay circuit arrangement described with reference to FIG. 3, hereinafter indicated for simplicity as a solid state relay, can be used in a solid state switching system, described with reference to FIG. 7 and successive figures, which presents characteristics of compatibility with all types of input sources. For example, taking into account audio sources, this system is capable of switching between each type of audio signal, or rather between zero mean signals and signals with offset (for example BTL, which are differential signals with offset or single-ended).

Figure 7:
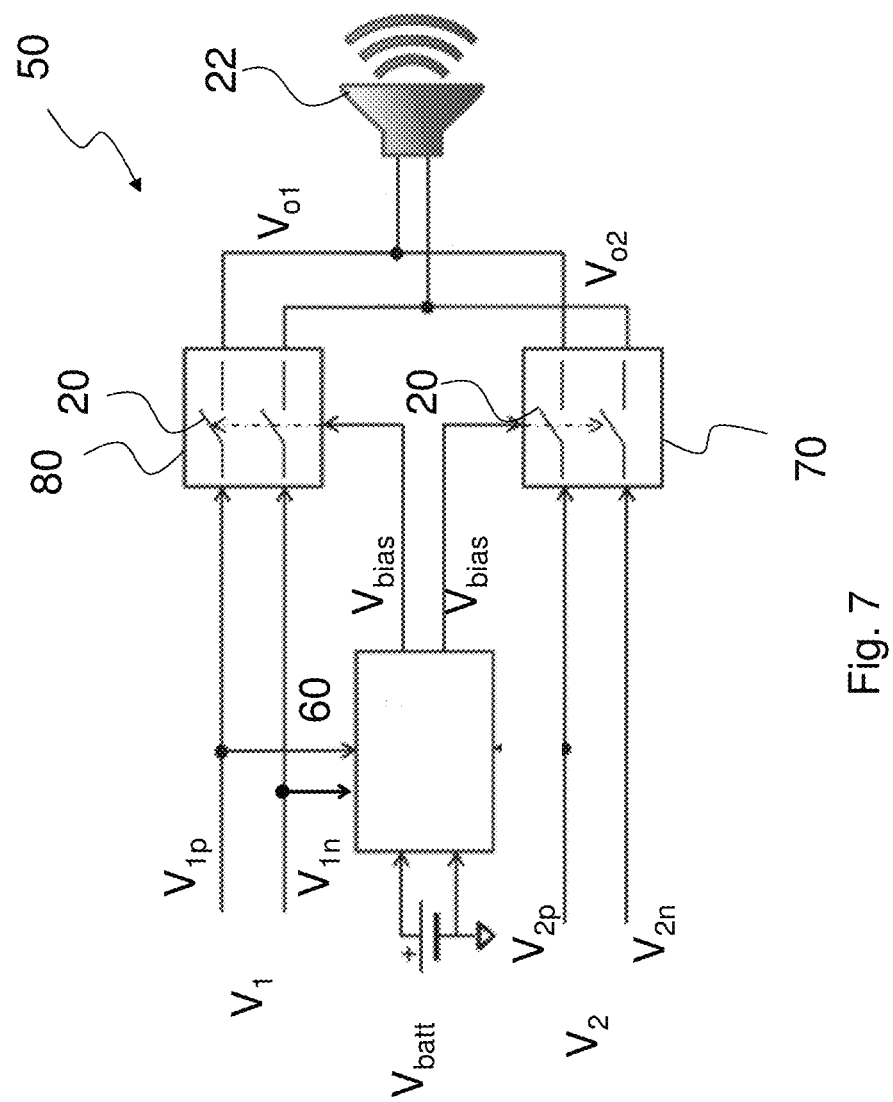
FIG. 7 shows a block diagram of a switching system according to the invention.

With the aim of guaranteeing this, the solid state relay 20 is driven through a sensing and driving circuit, indicated by 60 in FIG. 7, which receives the audio input signal (in the event of single-ended sources) or the input signals (in the case of differential sources) in input and supplies a driving voltage to the solid state relay circuit arrangements 20 as a function of the type of input signals, either with offset or zero mean.

FIG. 7 therefore shows a block diagram of an audio switching system, indicated as a whole by the reference number 50, which comprises the association of the sensing and driving circuit 60, and solid state relay 20. This sensing and driving circuit 60 is, in particular, configured to provide a first value of driving voltage to the relays 20 if the input signal is of the type with offset, in particular differential, in particular BTL, and a second value of the driving voltage to the relays 20 if there is a zero mean input signal.

In this audio switching system 50, a first input signal $V_1$ is present at the input, of the differential type in the example, in particular BTL, therefore having a positive signal $V_{1p}$ and a negative signal $V_{1n}$, which are brought to the input of a pair of respective solid state relays 20 in a relay block 80, which provide respective output signals $V_{o1}$ and $V_{o2}$ to the two differential inputs of a loudspeaker 22. Analogously, a second differential input signal $V_2$ is present, having a positive signal $V_{2p}$ and a negative signal $V_{2n}$, which are brought to the input of a pair of respective solid state relays 20 in a relay block 80, which provide respective output signals $V_{o1}$ and $V_{o2}$ to the two differential inputs of the loudspeaker 22.

The sensing and driving circuit 60 takes the input signals $V_1$ and/or $V_2$, in particular in the example, it takes the positive and negative signals $V_{1p}$ and $V_{1n}$ of the first input signal $V_1$ and receives a supply voltage, in particular a battery voltage $V_{batt}$ of a motor vehicle, supplying the driving voltage $V_{bias}$ in output to the solid state relays 20 necessary for driving their switching, according to that indicated in detail with reference to FIGS. 9, 10 and 11.

This sensing and driving circuit 60, as better described with reference to FIG. 8, is a switched capacitance circuit of an unconventional type, where a switch, 62 in FIG. 8, operates as a low-side switch, which operates at a switching frequency $f_{sw}$, while a switch 71 is used to deactivate the solid state relay 20, in particular by connecting the driving signal $V_{bias}$ to ground.

In particular, in the sensing and driving circuit 60, the differential signals $V_{1p}$ and $V_{1n}$ from a differential sources block 61, are made to flow, via respective branches that comprise diode-resistance pairs 63n and 63p, to a switching node M, which is selectively connected to ground through the switch 62. One terminal of a capacitor 65 is connected to the switching node M, while the other identifies a node N, which is also connected to the input nodes of the voltages $V_{1p}$ and $V_{1n}$ through diodes 66n and 66p, in direct conduction with respect to these signals. The node N is connected through a diode-resistance pair 67 to an output node O on which the driving voltage $V_{bias}$ is formed. A capacitor 68 is connected between this output node O and ground. Preferably, this capacitor 68 is in common with the relay, or rather, the capacitor 31 is divided (as in the implementation shown below with reference to FIG. 12). The output node O is also connected to the battery voltage $V_{batt}$ through a respective diode-resistor pair 69.

Figure 12:
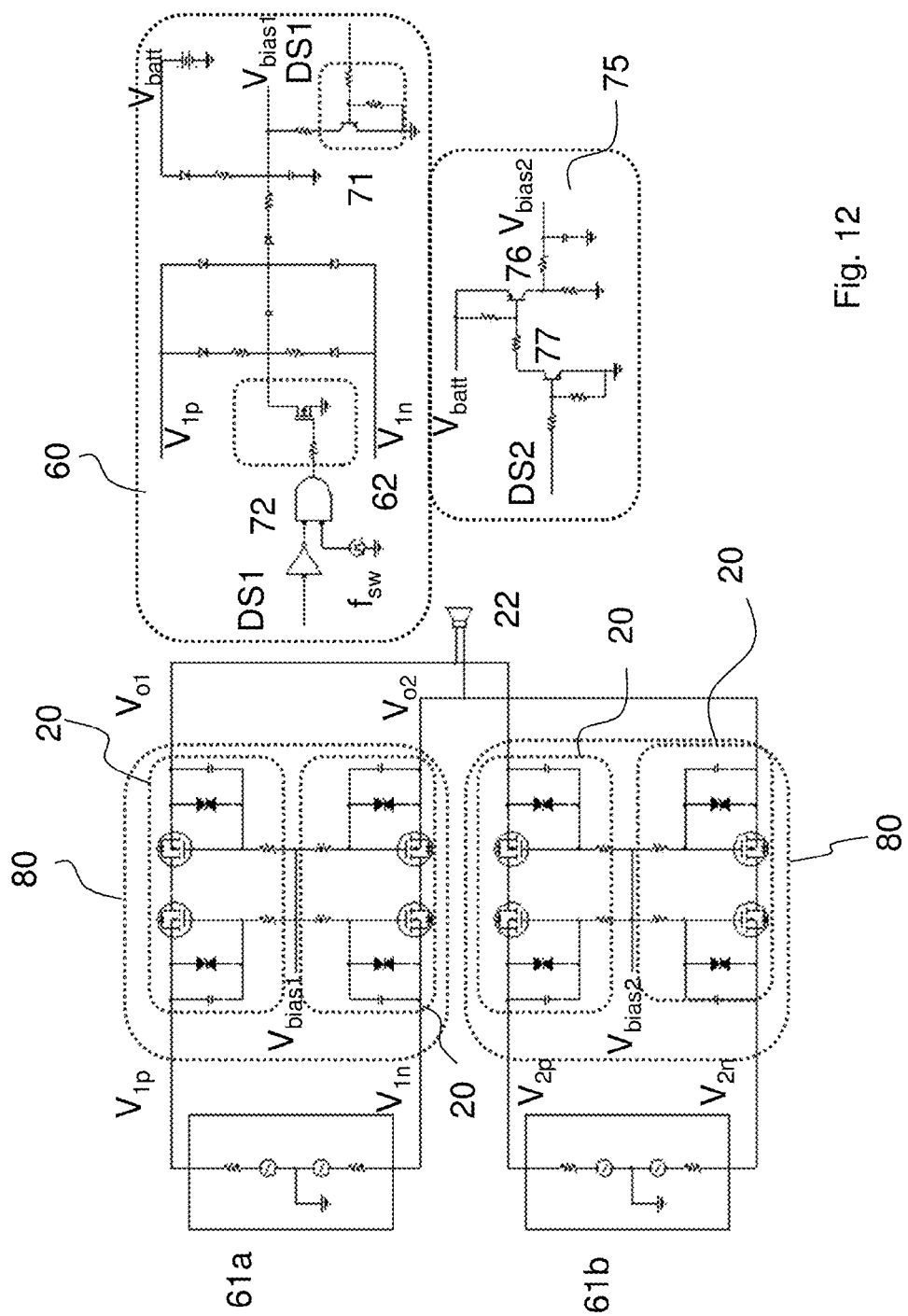
FIG. 12 shows a circuit diagram of the system of FIG. 7.

Furthermore, the output node O is selectively grounded by a deactivation switch 71 controlled by a deactivation signal of the bias voltage DS1, which essentially corresponds to the control signal for opening or closing of the relay 20. If the deactivation signal DS1 has a voltage logic value for closing the switch 71, the polarization voltage $V_{bias}$ is zero and the relay 20 remains open, while if the deactivation signal DS1 has a voltage logic value for opening the switch 71, the polarization voltage $V_{bias}$ has the value set by the sensing and driving circuit 60 and, therefore, the relay 20 is closed. As shown in FIG. 12, preferably this deactivation signal DS1 is also used to deactivate the switch 62. Thus, the sensing and driving circuit 60 is also configured to receive a control logic signal, DS1 and to activate and deactivate the emission of said polarization voltage $V_{bias}$ as a function of the value assumed by said control logic signal DS1, which in practice governs the status of the ON or OFF switch.

This sensing and driving circuit 60, as said generates the driving voltage $V_{bias}$ $V_{bias}$ in order to adapt the driving voltage according to the characteristics of the input signal, or rather, the signal of the audio source.

The sensing circuit ensures the defining of a driving voltage based on the characteristics of the input signal $V_{s1}$ or of the differential input signals $V_{1n}$ and $V_{1p}$. If the signal results as zero mean (signal that can be differential or single-ended) the sensing circuit ensures the generation of the bias voltage by use of a branch, in particular the diode-resistor branch 69.

If the input signal $V_{s1}$ has offset, a fact that can occur both in the single-ended case with offset and the differential BTL, or rather, differential signal with offset, the driving voltage $V_{bias}$ is generated by the circuit portion B, comprised between the sources 61 and the node O.

In the single-ended case, distinction must be made as to whether the signal has offset or not, as explained above.

When a BTL (Bridge Tied Load) input source with offset $V_{off}$ is applied, the driving voltage $V_{bias}$ must be greater than $V_{off}+V_{th1,2}$ in order to allow the conduction of the MOSFETs M1 and M2.

When the switch 62 is closed, the capacitor 65 is loaded, as shown in FIG. 9.

The arrow BP indicates the path of the loading current of the capacitor 65 when the switch 62, at time n−1, is closed and the positive input signal $V_{1p}$ is above its mean voltage value (at the same time, the negative voltage $V_{1n}$ is below its mean value).

The arrow RP indicates the path of the loading current of the capacitor 65 when the second input signal $V_{2p}$ is above its mean value (at the same time, the negative input signal $V_{1n}$ is below its mean value).

The capacitor 65 is loaded to the voltage $V_{C1}(n-1)$:

$$V_{C1}(n-1)=V_{1,2_{peak}}(n-1)-V_{DN}$$

or rather, the peak value of the input signal $V_{1,2_{peak}}(n-1)$ minus the voltage $V_{DN}$, or rather, the driving voltage of the diodes 66p, 66n between the input nodes and the node N.

The path of the current of the capacitor 65 when the switch 62 is opened (time n) is represented in FIG. 10.

The voltage at the output node O, through the capacitor 68, or rather $V_{C2(n)}$ is worth:

$$V_{C2}(n)=V_{C1}(n-1)+V_{1,2_{peak}}(n)-V_{DM}-V_{DNO}$$

or rather, the voltage $V_{C1}$ on the capacitor 65 at time n−1, plus the peak voltage at time n, minus the polarization voltage $V_{DM}$ on the diode 63p, 63n between the input node and the node M and minus the polarization voltage $V_{DNO}$ of the diode 67 between node N and output node O.

In this case, the standard driving voltage $V_{bias}$ is worth:

$$V_{bias} \cong 2*V_{1,2_{peak}}(n)-3*V_{DN}$$

The driving voltage $V_{bias}$ is always greater than the sum of the offset voltage and the threshold voltage (threshold $V_{gs}$) of the MOSFETs $V_{off}+V_{th1,2}$, even when the alternate component of the differential input voltages $V_{s1,2}$ assumes low values. The worst case is when the alternate component of the input voltages $V_{1,2}$ is equal to zero. In this case, the driving voltage $V_{bias}$ is:

$$V_{bias}=2*V_{off}-3*V_{DN}$$

The considered conditions are valid for a value of offset voltage $V_{off}$ greater than the supply voltage $V_{batt}$. In particular, the circuit portion B in FIG. 8 is used to produce a correct driving voltage $V_{bias}$, required to send the MOSFETs into conduction, when the offset voltage of the input signal $V_{s1,2}$ is:

$$V_{off} > V_{batt} - V_{th1,2}$$

where $V_{batt}$ is the supply voltage, for example, that of the main battery of a motor vehicle. Note that to send the MOSFETs into the ohmic region and therefore to guarantee a good conduction, the offset voltage must be much greater than the supply voltage, or rather $$V_{off} >> V_{batt} - V_{th1,2}.$$

Otherwise, when the offset voltage $V_{off} < V_{batt} - V_{th1,2}$ ($V_{off} << V_{batt} - V_{th1,2}$) or when the input sources are of the zero mean-type signal, the conduction of the MOSFETs M1, M2 through the application of a driving voltage $V_{bias}$ of sufficient amplitude is allowed by the diode and by the resistance of the diode-resistance pair 69, as shown in FIG. 11, but in the case of zero mean signal, the battery voltage $V_{batt}$ must be greater than the threshold voltage $V_{gs1,2\_th}$ of the MOSFETs. In this case, the driving voltage $V_{bias}$ is essentially equal to the battery voltage $V_{batt}$, in particular $V_{batt}$ minus the drop on a diode.

In the diagrams of FIGS. 9, 10, 11, the deactivation signal DS1 is always such that the switch 71 is open, or rather, the driving voltage $V_{bias}$ is supplied to the relays 20, bringing them to the ON state.

Note that these diagrams refer to a circuit 60 configured to operate with the circuit reported in FIG. 12, which is intended to be used, for example, in a TCU (Telematic Control Unit) device with GPS tracking and mobile communication functions, for example, GSM, where an audio switch is required, which, for example, during an emergency call, referred to as "e-Call", interrupts the signal coming from an external radio module (AHU: Audio Head Unit) in order to be able to transmit this voice call to the speakers. By default, the switch 71 must be configured to be able to transmit the signal coming from the external radio module towards the speakers.

Therefore, the sensing and driving circuit 60:

if it has a differential signal at its input, in particular BTL, with offset, it provides a first driving voltage value $V_{bias}$ to the relays 20, approximately equal to double the peak voltage $V_{1,2peak}$ of the input signal $V_1$, $V_2$ minus three times the value of the polarization voltage of three diodes $V_{DN}$:

$$V_{bias} \cong 2 * V_{1,2peak}(n) - 3 * V_{DN}$$

As said, the solid state relay 20 operates with a greater driving voltage $V_{bias}$ than the offset voltage plus the gate-source voltage $V_{gs}$, $$V_{bias} \geq V_{off} + V_{gs1,2\_th}$$

the circuit 60, in the case of BTL signal with offset, ensures a driving voltage $V_{bias}$ more than enough to take the relay 20 into the ON state;

when the input sources are of the zero mean type signal, the circuit 60 supplies a second driving voltage value $V_{bias}$ to the relays 20: the driving voltage $V_{bias}$ is equal to the battery voltage $V_{batt}$, in particular minus the drop on the diode of the branch 69 $V_{Diodo}$.

$$V_{bias} = V_{batt} - V_{Diodo}$$

The circuit 60 is used with signals (differential or single-ended) with offset or zero mean. When the signals are provided with offset, the circuit B operates to generate the driving voltage $V_{bias}$. If the signals are zero mean, the circuit 60 is such that the portion of the circuit relative to the branch 69 operates.

The driving circuit 60 adapts automatically according to the characteristics of the signal, that is, whether it has offset or is zero mean, as the circuit B produces no voltage at the node N if the signals are zero mean. In this case, the driving voltage is generated through the branch 69.

If the input signals are provided with offsets, the circuit B generates the driving voltage $V_{bias}$ and the diode of the branch 69 is prevented.

As mentioned, the main application of the circuit arrangement and of the corresponding switching system described here has a switch for an audio loudspeaker in a Telematic Control Unit (TCU), in which it is required to switch the audio path from the external audio module to the internal audio amplifier, which becomes active during e-Call-type voice communications.

The solid state relay circuit arrangement 20 and the corresponding system allow the use of solid-state devices in place of electromechanical relays, avoiding the problems associated with this type of relay, using a low driving voltage, despite the high signal dynamics for audio applications and also minimizing distortion problems.

FIG. 12 shows, in this respect, a complete circuit application of the switch described, in particular for a switch for an audio loudspeaker in a telematic control unit.

The generators 61a for the first signal $V_{1p}$, $V_{1n}$ and 61b for the second signal $V_{2p}$, $V_{2n}$, relative to, for example, an external audio module and an audio amplifier of a TCU device, respectively, are sent to the inputs of the switching blocks 80 towards the respective relays 20.

The relays 20 of the first signal $V_{1p}$, $V_{1n}$ are controlled by a first polarization signal $V_{bias1}$, while the relays 20 of the second signal $V_{2p}$, $V_{2n}$ are controlled by a second polarization signal $V_{bias2}$, which are provided by the sensing and driving circuit 60. This circuit 60 is represented in an analogous way to the circuit of FIG. 8, but the use of an AND gate 72 is also detailed, which receives the deactivation signal DS1 at its inputs and the square-wave at frequency $f_{sw}$ to drive the switched capacitor 65, so as to deactivate the operation of the switch 62.

Numeral 75 indicates a circuit for generating the second driving signal $V_{bias2}$, under the control of a corresponding deactivation signal DS2, through a first bipolar transistor 77, controlled by the deactivation signal DS2, which, in turn, controls the operation of an output transistor 77, which generates the voltage $V_{bias2}$. The deactivation signal DS2 has equal logic value with respect to DS1, but dead times must be introduced, between the switching cycles of the signals DS1 and DS2, so as to avoid phenomena of cross conduction between the two branches of the solid state relays, as shown in FIG. 13.

FIG. 12 shows a second simplified driving circuit 75, in place of a replica of the circuit 60. In fact, this simplified driving circuit 75 is used to drive the switch relative to the source 61b, audio amplifier, during the e-Call. The dynamics of the signal of the internal amplifier to the TCU, which causes the second signal $V_{2p}$, $V_{2n}$, is in fact such as to be able to drive the corresponding switch 20 with a driving voltage $V_{bias2}$ equal to the battery voltage $V_{batt}$.

Figure 13:
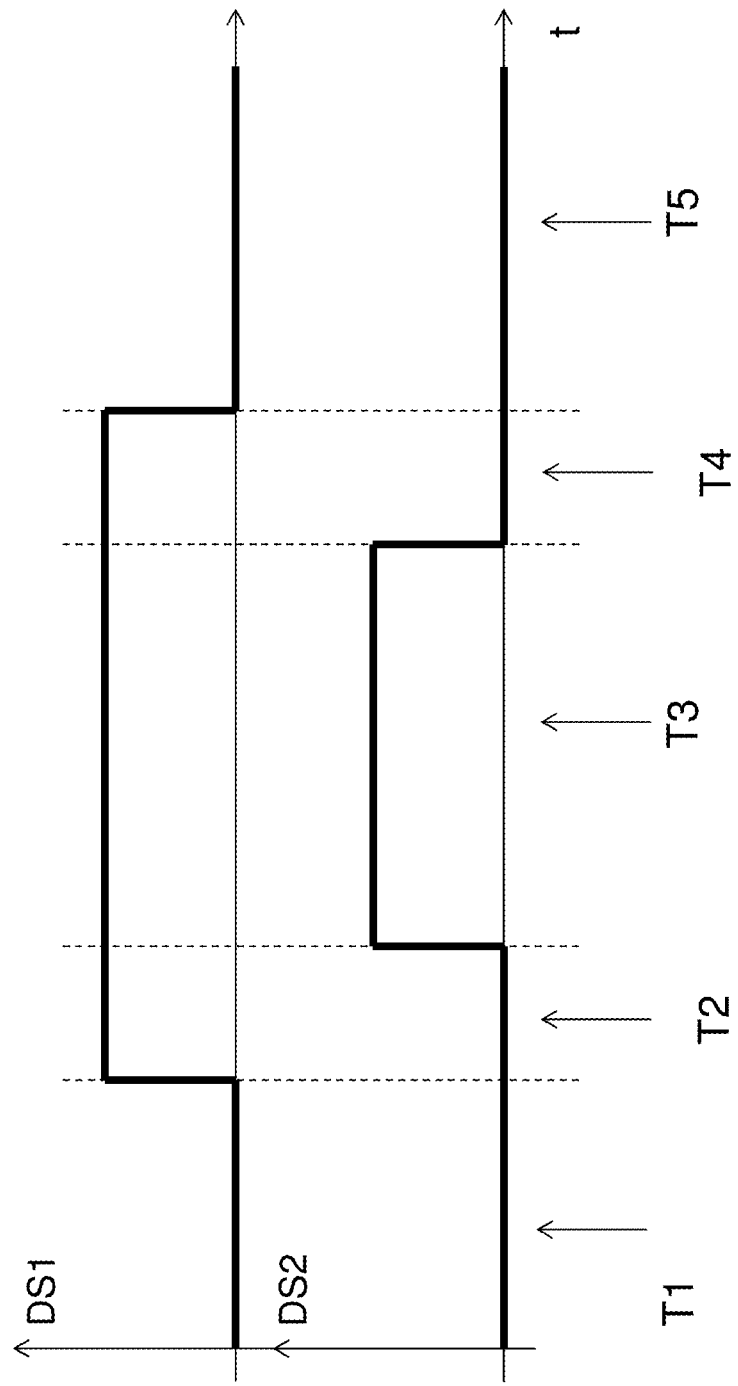
FIG. 13 shows diagrams of signals operating in the circuit of FIG. 12.

The waveforms of the deactivation signals DS1 and DS2 are shown in FIG. 13.

As said, the second deactivation signal DS2 has a shorter ON period, due to the introduction of dead times T2 and T4. In particular, in a period T1, the signals DS1 and DS2 are both at a low level, so that the switches 80 are configured overall to connect the external radio module of the first input signals to the speakers 22. In the subsequent period T2, the first deactivation signal DS1 is high, but the second deactivation signal DS2 is kept low, identifying a dead time, which still maintains the switch inactive, in order to avoid cross-conduction phenomena. Then, in a subsequent period T3, the second deactivation signal DS2 also reaches the high level, therefore the switches 80 are configured overall to connect the second input signal, relative to the amplifier TCU, to the speaker 22. Symmetrically, in the successive period T4—dead time relative to the transition from high to low—only the second deactivation signal DS2 is brought to a low level, maintaining the switching deactivated and avoiding cross-conduction. Finally, in a period T5, the first deactivation signal DS1 is also brought to a low level, so that the switches 80 are again configured overall to connect the external radio module of the first input signals to the speakers 22.

Therefore, from that described above, there are clear advantages of the proposed solution.

The solid state relay circuit arrangement described allows the straight-forward driving of the MOSFETs in the case of an input signal with a high dynamic range in amplitude, as in the case of audio sources. In fact, it is possible to drive the MOSFETs without using a driving voltage greater than the maximum peak voltage of the input signal. In fact, it is:

$$V_{bias} \geq V_{off} + V_{gs1,2\_th}$$

The solid state relay circuit arrangement described here presents a further advantage with respect to the prior art: a linear characteristic of the switch is obtained when it is turned on, in order to minimize the distortion of the signal. In fact, this circuit arrangement advantageously allows the presence of a constant gate-source voltage $V_{gs1,2}$, even with signals with a high input dynamic range, and therefore there is no distortion on the load of the switching circuit.

Advantageously, a switching system is obtainable which uses the solid state relay circuit arrangement described, and, moreover, allows the switching of different signal types, through the use of a sensing and driving circuit for controlling this solid state relay circuit arrangement.

The invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

What is claimed is:

1. A solid state relay circuit arrangement for audio signals, of the type comprising a first MOSFET and a second MOSFET disposed in a back-to-back relationship with respect to each other and so as to receive an input signal on the source electrode of the first MOSFET and to take the output signal on the source electrode of the second MOSFET, with a driving voltage being applied to the gate electrodes of said first MOSFET and second MOSFET, apt to change, on the basis of its value, the operational state of said first MOSFET and second MOSFET, each of said first MOSFET and second MOSFET including a respective bypass capacitor arranged between its source electrode and its gate electrode, having such a capacitance value to determine a bypass path for the input signal from the source electrode to the gate electrode in the operating frequency range of said input signal.

2. The circuit arrangement as set forth in claim 1, further including an RC network interposed between a driving voltage generator and the gates of the MOSFETs, the value of the components of said RC network cooperating with the capacitance values of the bypass capacitors to define a lower operation cut-off frequency of said circuit arrangement.

3. The circuit arrangement as set forth in claim 2, further including resistors connected at one of its ends to respective gates of the MOSFETs and a capacitor connected between the other end of said resistors and ground.

4. The circuit arrangement as set forth in claim 2, wherein said cut-off frequency is lower than the minimum frequency of an audio spectrum associated with the input signal.

5. A system for switching two or more input signals onto an output load, in particular a speaker, comprising solid state relay circuit arrangements on the path of said audio signals able to selectively interrupt said path under the control of a respective driving signal, wherein said system includes a solid state relay circuit having a first MOSFET and a second MOSFET disposed in a back-to-back relationship with respect to each other and so as to receive an input signal on the source electrode of the first MOSFET and to take the output signal on the source electrode of the second MOSFET, with a driving voltage being applied to the gate electrodes of said first MOSFET and second MOSFET, apt to change, on the basis of its value, the operational state of said first MOSFET and second MOSFET, each of said first MOSFET and second MOSFET including a respective bypass capacitor arranged between its source electrode and its gate electrode, having such a capacitance value to determine a bypass path for the input signal from the source electrode to the gate electrode in the operating frequency range of said input signal.

6. The system as set forth in claim 5, further including a sensing and driving circuit, which receives the input signals and is configured to supply a different driving signal to said solid state relay circuit arrangements as a function of the type of input signals.

7. The system as set forth in claim 6, wherein said sensing and driving circuit acts to supply a first driving voltage value if the input signal comprises an offset voltage and a second driving voltage value if the input signal is a zero mean signal.

8. The system as set forth in claim 6, wherein said sensing and driving circuit comprises
a first circuit portion configured to
supply said first driving voltage value if the input signal includes an offset voltage and
to not generate a voltage on an output node if the input signal is zero mean, and
a second circuit portion connected between a supply voltage, in particular a battery voltage, and said output node,
which is prevented from conducting by the voltage determined on said output node by said first circuit portion if the input signal includes an offset voltage, and
which is conducting if said first circuit portion does not generate a voltage on the output node.

9. The system as set forth in claim 5, wherein said sensing and driving circuit acts to receive a logic command signal and to activate and deactivate the issuing of said driving voltage as a function of the value taken by said logic command signal.

10. The system as set forth in claim 5, wherein said two audio signals are generated by a radio module and by an amplification module of a TCU device, and wherein said system comprises
- a sensing and driving circuit to supply the driving voltage to the solid state relay circuit arrangements adapted to interrupt the audio signal relative to the radio module, and a simplified driving signal configured to supply, as a function of a second logic command signal, a second driving voltage having the value of battery voltage, to the solid state relay circuit arrangements adapted to interrupt the audio signal relative to the amplification module, said second logical command signal taking logical states as a function of the time corresponding to those of the first logic command signal, in particular, introducing dead times with respect to the transitions of said first logic command signal.

* * * * *